United States Patent [19]

Nagasawa

[11] 4,370,623
[45] Jan. 25, 1983

[54] PUSH-PULL AMPLIFIER CIRCUIT

[75] Inventor: Hideki Nagasawa, Nagaoka, Japan

[73] Assignee: Kabushiki Kaisha Nagasawa, Nagaoka, Japan

[21] Appl. No.: 253,183

[22] Filed: Apr. 13, 1981

Related U.S. Application Data

[63] Continuation of Ser. No. 71,865, Sep. 4, 1979, abandoned.

[30] Foreign Application Priority Data

Sep. 14, 1978 [JP] Japan ................................ 53-113917

[51] Int. Cl.³ ............................................. H03F 3/26
[52] U.S. Cl. .................................... 330/267; 330/270
[58] Field of Search ................ 330/263, 267, 270, 297

[56] References Cited

U.S. PATENT DOCUMENTS 3,772,606 11/1973 Waehner ............................. 330/267

Primary Examiner—James B. Mullins
Assistant Examiner—Gene Wan
Attorney, Agent, or Firm—McAulay, Fields, Fisher, Goldstein & Nissen

[57] ABSTRACT

An amplifier arrangement is provided which comprises first and second biasing power supply circuits, a push-pull amplifier comprising a pair of transistors, a DC amplifier having a non-inverting input terminal connected to a junction point at which one half of a predetermined potential fed from the first biasing power supply circuit is applied and an inverting input terminal connecting a feedback loop through which the output the amplifier is fedback, a second biasing power supply circuit having a junction point at which the output of the DC amplifier is applied, and means responsive to an output of the DC amplifier for applying either of the first and second predetermined potentials fed from the first and second biasing circuits in accordance with the amount of feedback from the output of the push-pull amplifier to produce an output signal showing a biasing current, whereby the output signal is applied to each base of the push-pull transistors so as to balance the half potential of the first biasing power supply circuit with the potential at the output of the push-pull amplifier.

16 Claims, 8 Drawing Figures

PUSH-PULL AMPLIFIER CIRCUIT

This is a continuation, of application serial no. 071,865 (now abandoned) filed Sept. 4, 1979.

BACKGROUND OF THE INVENTION

The present invention relates to a push-pull amplifier, and more particularly to an amplifier circuit which makes it possible to automatically adjust a biasing current.

FIG. 1 is a circuit diagram of a conventional push-pull amplifier.

Referring to FIG. 1, $Q_1$ and $Q_2$ denote NPN and PNP transistors, respectively, $R_1$ and $R_2$ resistors for stabilizing a biasing current $I_B$, $Z_L$ load including reactance, $V_{BS}/2$ biasing power supply circuit, and $+V_{CC}$ and $-V_{CC}$ DC voltage power supplies, respectively.

If the input voltage $e_i$ is 0 volts, the electric potential at the output terminal P is approximately 0 volts. Since no load current $I_L$ flows, only a biasing current $I_B \simeq [V_{BS}-(V_{BE1}+V_{BE2})]/(R_1+R_2)$ flows between transistors $Q_1$ and $Q_2$.

However, assuming that the input voltage $e_i$ varies towards positive-going swing, the load current $I_L$ flows in the direction of the solid line shown in FIG. 1 from the transistor $Q_1$. Due to the voltage drop $I_L R_1$ across the resistor $R_1$, the biasing current $I_B$ decreases.

If the input voltage $e_i$ further increases and $I_L R_1 \geq V_{BS}-(V_{BE1}+V_{BE2})$ holds, the transistor $Q_2$ will be completely cut off.

In this condition, the push-pull circuit becomes equal to an emitter-follower circuit in which only transistor $Q_1$ is used, resulting in deterioration in the transient characteristics if the load $Z_L$ includes reactance.

On the other hand, when the input voltage $e_i$ varies towards negative-going swing, the load current $I'_L$ flows in the direction of the broken line in FIG. 1 to the transistor $Q_2$.

Accordingly, when $I'_L R_2 \geq V_{BS}-(V_{BE1}+V_{BE2})$ holds, transistor $Q_1$ is completely cut off, resulting in the same phenomenon.

In order to prevent this the push-pull circuit may, for instance, be greately biased to effect class "A" amplification. Thus, if the circuit is designed so that a biasing current $I_B$ flows, serving as an idling current whose value is of the order of magnitude of the load current $I_L$, some improvement may be expected.

However, with this conventional circuit, a low efficiency of amplification will be obtained. Moreover, in order not to allow transistors $Q_1$ and $Q_2$ to be completely cut off, the minimum impedance value of the load is limited to a predetermined value. Therefore, this method is not very satisfactory.

SUMMARY OF THE INVENTION

With the above in mind, an object of the present invention is to provide a push-pull amplifier circuit which makes it possible to keep a biasing current constant independent of the load current.

Another object of the present invention is to provide a push-pull amplifier circuit including a feedback loop for automatically adjusting a biasing current to obtain good transfer characteristics.

A further object of the present invention is to provide a push-pull amplifier circuit wherein the feedback loop mentioned above is designed so as to have a gain of unity to improve linearity of the transfer characteristics of the push-pull amplifier.

According to the present invention, there is provided an amplifier comprising a push-pull amplifier connected to a biasing power supply circuit for supplying a biasing current through a first diode to the push-pull amplifier, and a DC amplifier connected to an input of the push-pull amplifier via a second diode connected with the first diode in logical-sum fashion so as to balance the half potential of the biasing power supply circuit with the potential at the output of the push-pull amplifier, thereby maintaining the biasing current constant independent of the load current flowing during rated operation of the push-pull amplifier.

Further in accordance with the present invention, there is provided an amplifier arrangement which comprises a first and a second biasing power supply circuits, a push-pull amplifier comprising a pair of transistors, a DC amplifier having a noninverting input terminal connected to a junction point which one half of a predetermined potential fed from the first biasing power supply circuit is applied and having an inverting input terminal connected to a feedback loop through which the output of the amplifier is fedback, a second biasing power supply circuit having a junction point at which the output of the DC amplifier is applied, and means responsive to an output of the DC amplifier for applying either of the first and second predetermined potentials fed from the first and second biasing circuits in accordance with the amount of feedback from the output of the push-pull amplifier to produce an output signal is applied to each base of the push-pull transistors so as to balance the half potential of the first biasing power supply circuit with the potential at the output of the push-pull amplifier.

BRIEF DESCRIPTION OF THE DRAWINGS

The features and advantages of a push-pull amplifier circuit according to the present invention will become more apparent from the following description taken in conjunction with the accompanying drawings, in which.

DETAILED DESCRIPTION OF THE PREFERRED EMBODIMENTS

Referring to FIG., 2, $Q'_1$ and $Q'_2$ denote NPN and PNP transistors, respectively, $R'_1$ and $R'_2$ are resistors for stabilizing a biasing current $I'_B$, $Z'_L$ is a load including reactance, $V'_{BS}/2$ is a biasing power supply circuit, and $+V'_{CC}$ and $-V'_{CC}$ respectively, are positive and negative DC power supplies. A and $V''_{BS}/2$ denote a DC amplifier and biasing power supply circuits, respectively, which are newly added in the present invention.

$D_1$, $D_2$, $D_3$, and $D_4$ denote diodes for preventing reverse direction current in the biasing power supply circuits and for applying either of the output of the biasing circuit already provided in the prior art circuit and the output of the biasing circuit newly added according to the present invention in accordance with the amount of feedback from the output of the push-pull amplifier.

Now, let the gain of the DC amplifier be designated by A. Then, suppose that settings are made such that the offset voltage is zero, biasing voltages $V'_{BS}/2$ and $V''_{BS}/2$ are equal, the emitter resistances $R'_1$ and $R'_2$ of the transistors $Q'_1$ and $Q'_2$ equal each other, the forward voltages $V_D$ across diodes $D_1$, $D_2$, $D_3$ and $D_4$ equal each other, and the forward voltages $V_{BET}$ between base and emitter electrodes of the transistors $Q'_1$ and $Q'_2$ equal each other.

Electric potentials $e_a$ and $e_o$ at output terminal C of the DC amplifier and at output terminal p' of the push-pull amplifier are determined from the input voltage $e_i$ and the load current $I''_L$ as follows;

$$e_a = \frac{A}{2+A} e_i + \frac{A}{2+A} R'_1 I''_L \quad (1)$$

$$e_o = \frac{1+A}{2+A} e_i - \frac{1}{2+A} R'_1 I''_L \quad (2)$$

If the gain of the DC amplifier is sufficiently large, equations (1) and (2) may be regarded as the following equations (1)' and (2)', respectively:

$$e_a \simeq e_i + R'_1 I''_L \quad (1)'$$

$$e_o \simeq e_i \quad (2)'$$

Equation (1)' shows that the output $e_a$ of the DC amplifier varies according to increase and decrease of the load current, and the current flow direction.

Equation (2)' shows that the output voltage $e_o$ of the push-pull amplifier is independent of increases and decreases of the load current.

The concept expressed by the above equations (1), (2), (1)' and (2)' is essential for the present invention. Accordingly, it is important to refer to details of the derivation thereof for a better understanding of the present invention.

Figure 1:
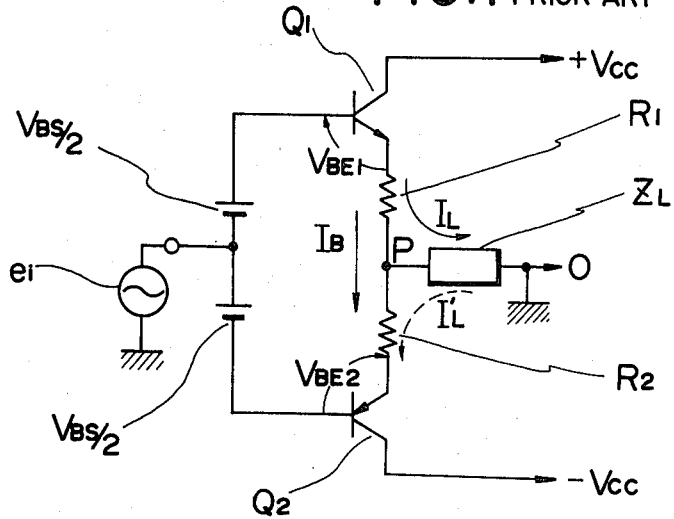
FIG. 1 is a circuit diagram of a conventional push-pull amplifier circuit.
Figure 2:
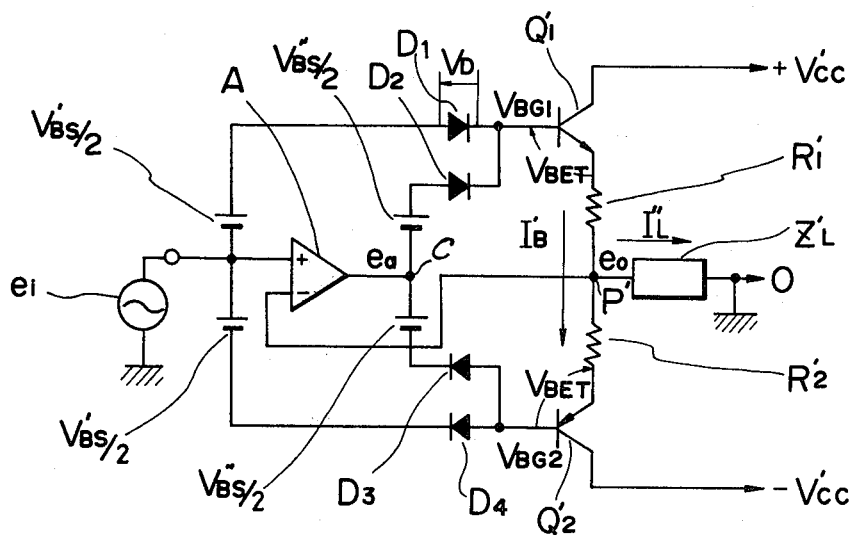
FIG. 2 is a circuit diagram of a push-pull amplifier circuit according to the present invention.

In FIG. 2, a non-inverting input terminal and an inverting input terminal of the differential amplifier are connected to the input voltage $e_i$ and the output terminal p' of the push-pull amplifier, respectively. Accordingly, assuming that the gain of the differential amplifier is A, the output voltage $e_a$ is expressed by the following equation;

$$e_a = (e_i - e_o)A \quad (i)$$

Suppose that $e_a > e_i$, the diode $D_2$ becomes conductive, and $D_1$ becomes nonconductive, then $D_4$ becomes conductive, and $D_3$ becomes nonconductive. The following equations are derived on the basis of this supposition.

Calculating the output voltage $e_a$ of the differential amplifier from the path through the diode $D_2$ to the load $Z'_L$, the following equation is obtained.

$$e_a = e_o + R'_1(I'_B + I''_L) + V_{BET} + V_D - V''_{BS}/2 \quad (ii)$$

Calculating the biasing current $I'_B$ flowing in transistors $Q'_1$ and $Q'_2$ from the path through the diode $D_4$ to the load $Z'_L$, the following equation is obtained.

$$I'_B = \frac{e_o - (e_i - V'_{BS}/2 + V_D + V_{BET})}{R'_2} \quad (iii)$$

Substitution of equation (iii) into equation (ii) gives:

$$e_a = e_o + R'_1 e_o/R'_2 - R'_1 e_i/R'_2 + R'_1 V'_{BS}/2R'_2 - R'_1 V_D/R'_2 - R'_1 V_{BET}/R'_2 + R'_1 I''_L + V_{BET} + V_D - V''_{BS}/2$$

Taking into account $R'_1 = R'_2$, and $V'_{BS}/2 = V''_{BS}/2$ $$e_a = 2e_o - e_i + R'_1 I''_L \quad (iv)$$

is obtained. Elimination of $e_a$ from equations (i) and (iv) gives:

$$(e_i - e_o)A = 2e_o - e_i + R'_1 I''_L \quad (2)$$

$$(2 + A)e_o = (1 + A)e_i - R'_1 I''_L$$

$$e_o = \frac{1+A}{2+A} e_i - \frac{1}{2+A} R'_1 I''_L$$

Similarly, elimination of $e_o$ from equations (1) and (iv) gives:

$$e_a = \frac{A}{2+A} e_i + \frac{A}{2+A} R'_1 I''_L \quad (1)$$

In the above calculation, it was assumed that $e_a > e_i$, but if assuming that $e_a < e_i$, the diode $D_2$ becomes nonconductive, the diode $D_1$ becomes conductive, the diode $D_4$ becomes nonconductive, and $D_3$ becomes conductive. From the path through the diode $D_3$ to the load $Z'_L$, a calculation of the output voltage $e_a$ of the differential amplifier is carried out to obtain the following equation similar to the equation (ii), $$e_a = e_o - R'_2(I'_B - I''_L) - V_{BET} - V_D + V''_{BS}/2 \quad (ii)'$$

Furthermore, from the path through the diode $D_1$ to the load $Z'_L$, a calculation of the biasing current $I'_B$ flowing in transistors $Q'_1$ and $Q'_2$ is carried out to obtain the following equation, $$I'_B = \frac{e_i + V'_{BS}/2 - V_D - V_{BET} - e_o}{R'_1} \quad (iii)'$$

Substitution of equation (iii)' into equation (ii)', in consideration of $R'_1 = R'_2$ and $V'_{BS}/2 = V''_{BS}/2$, gives $$e_a = 2e_o - e_i + R'_1 I''_L \quad (iv)'$$

which is the same as equation (iv). Similarly, from equations (i) and (iv)' $e_a$ and $e_o$ are obtained with the same formulation as equations (1) and (2). Accordingly, it is understood that equations (1) and (2) always hold irrespective of the signs of the terms. As A goes to infinity, equations (1) and (2) become $$e_o \simeq e_i + R'_1 I''_L \quad (1)'$$

$$e_o \simeq e_i \quad (2)'$$

Thus, equations (1)' and (2)' are obtained.

Suppose that the base electrode voltages of the transistors $Q'_1$, $Q'_2$ with respect to ground are $V_{BG1}$, and $V_{BG2}$, respectively.

The values of the voltages $V_{BG1}$ and $V_{BG2}$ are classified into the following cases, in accordance with the states of the diodes $D_1$ to $D_4$, and the polarity of the load current $I''_L$ (1) $I''_L \geq 0$ (when $I''_L$ flows in the direction of the arrow in FIG. 2.)

$$V_{BG1} = V_{BS}/2 + e_i + R'_1 I''_L - V_D \quad (3)$$

$$V_{BG2} = V_{BS}/2 + e_i + V_D \quad (4)$$

(2) $I''_L < 0$ (when $I''_L$ flows in the direction opposite to the arrow in FIG. 2.)

$$V_{BG1} = V_{BS}/2 + e_i - V_D \quad (3)'$$

$$V_{BG2} = -V_{BS}/2 + e_i + R'_1 I''_L + V_D \quad (4)'$$

In equation (3), diode $D_2$ is conducting but the diode $D_1$ is cut off because of the inverse bias.

In equation (4), diode $D_4$ is conducting but the diode $D_3$ is cut off because of the reverse bias.

On the other hand, in equation (3)' the diode $D_1$ is conducting, but the diode $D_2$ is cut off and in equation (4)' the diode $D_3$ is conducting, but the diode $D_4$ is cut off.

Thus, it is possible to apply either of the output of each biasing circuit, thereby maintaining a biasing current constant independent of the load current.

Figure 3:
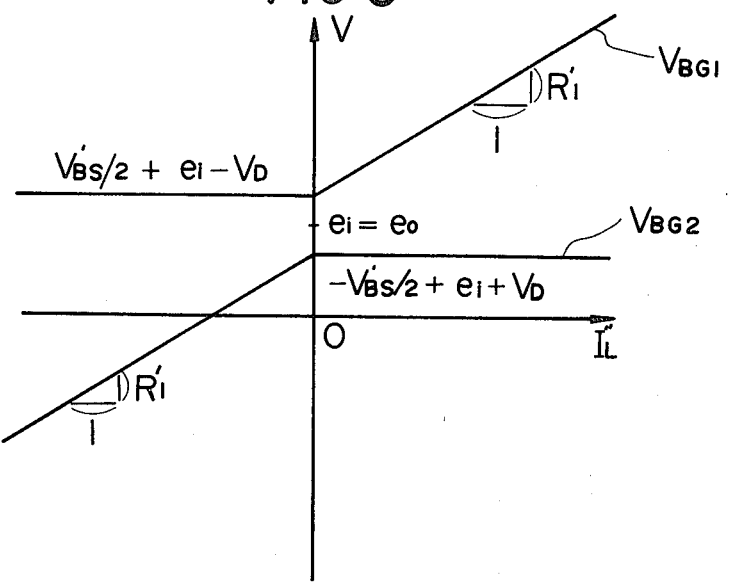
FIG. 3 is a graph illustrating characteristics of load current versus biasing electric potential according to the present invention.

FIG. 3 is a graph of the voltages $V_{BG1}$ and $V_{BG2}$ against the load current $I''_L$.

In FIG. 3, $I''_L$ and voltages are abscissas and ordinates, respectively, and the input voltage $e_i$ is indicated on the V axis.

The graph of the voltages $V_{BG1}$ and $V_{BG2}$ has a rotational symmetry with respect to the value $e_i$ on the V axis. When the transistor $Q'_1$ becomes operative so that load current $I''_L$ flows in the positive direction, the voltage $V_{BG1}$ increases by the voltage drop occurring across the emitter resistor $R'_1$ of the transistor $Q'_1$, thereby keeping the potential level of the output terminal P equal to that of $e_i$.

On the contrary, when the transistor $Q'_2$ becomes operative so that the load current $I''_L$ flows in the negative direction, $V_{BG2}$ is lowered by the voltage drop produced across the emitter resistance $R'_2$ of the transistor $Q'_2$, thereby keeping the potential $e_o$ at the output P of the push-pull circuit equal to that of $e_i$.

Thus, a constant biasing voltage is applied to whichever transistor is not conducting.

That is, constant biasing voltage potentials $V'_{BS}/2 - V_D$ and $-V'_{BS}/2 + V_D$ are applied between the bases of transistors $Q'_1$ and $Q'_2$, respectively, and the output of the push-pull circuit. Accordingly, it is possible to maintain a constant bias current $I'_B = [V'_{BS}\alpha/2 - (V_D + V_{BET})]/R'_1$ between the emitter electrodes of the transistors $Q'_1$ and $Q'_2$.

It will now be shown that, according to the present invention, irrespective of the value of the load current $I''_L$, neither of the transistors $Q'_1$ and $Q'_2$ constituting the push-pull amplifier are ever put in the nonconducting state.

Figure 4:
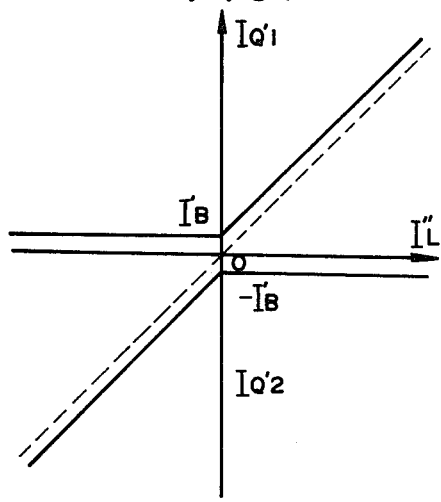
FIG. 4 is a graph illustrating load current versus biasing electric current characteristics and transfer characteristics according to the present invention.

FIG. 4 is a graph illustrating the relationship between the load current $I''_L$ and the emitter currents of the transistors $Q'_1$ and $Q'_2$ according to the present invention.

Figure 5:
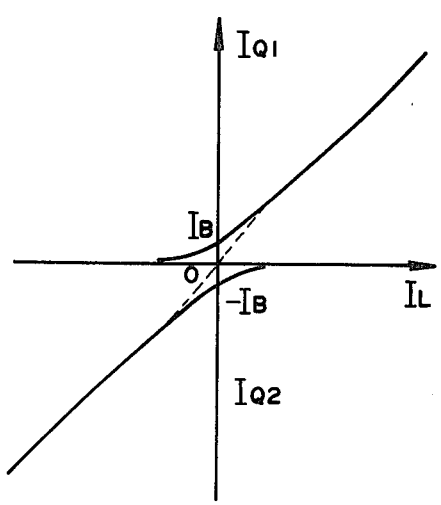
FIG. 5 is a graph illustrating load current versus biasing current characteristics and transfer characteristics according to conventional push-pull amplifier circuit.

FIG. 5 shows a similar relationship according to a conventional circuit.

As will be seen from FIG. 4, a predetermined bias current $I'_B$ flows in the transistor which is not conducting.

On the contrary, in the conventional circuit shown in FIG. 5, a bias current flows only when the load current $I_L$ is in the vicinity of zero. When the load current $I_L$ increases or decreases, one of the transistors $Q_1$ or $Q_2$ will be cut off.

Another drawback of the conventional circuit is that the transfer characteristic of the push-pull amplifier has curved portion where the load current is in the vicinity of zero, as shown by a broken line in FIG. 5, while, as shown by a broken line in FIG. 4, the transfer characteristic of a push-pull circuit according to the present invention has good linearity since a large negative feedback is supplied to the push-pull circuit.

Figure 6:
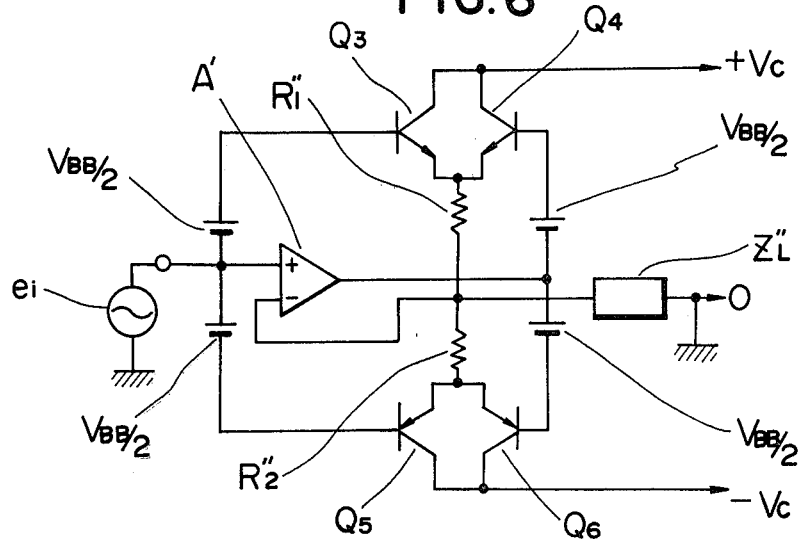
FIG. 6 is a circuit diagram of a modification of a push-pull amplifier circuit according to the present invention.

FIG. 6 shows a circuit which is a modified version of the present invention, using transistors to provide the selecting of either of the outputs of each biasing circuit and push-pull operation, in place of the diodes used in the basic circuit shown in FIG. 2.

In FIG. 6, $Q_3$ and $Q_4$ denote NPN transistors, $Q_5$ and $Q_6$ PNP transistors, $R''_1$, $R''_2$ resistors for stabilizing a bias current, $Z''_L$ a load including reactance, $V_{BB}/2$ bias power supply circuit, $+V_c$ and $-V_c$ plus and minus power supplies, and $A'$ a DC amplifier.

The basic operation is the same as that of the basic circuit shown in FIG. 2, but by making judicious use of inverse voltages between the base and emitter electrodes of transistors $Q_3$, $Q_4$, $Q_5$ and $Q_6$, the same effect as with the diodes in the basic circuit is obtained. It is to be noted that these transistors also effect the push-pull operation.

Figure 7:
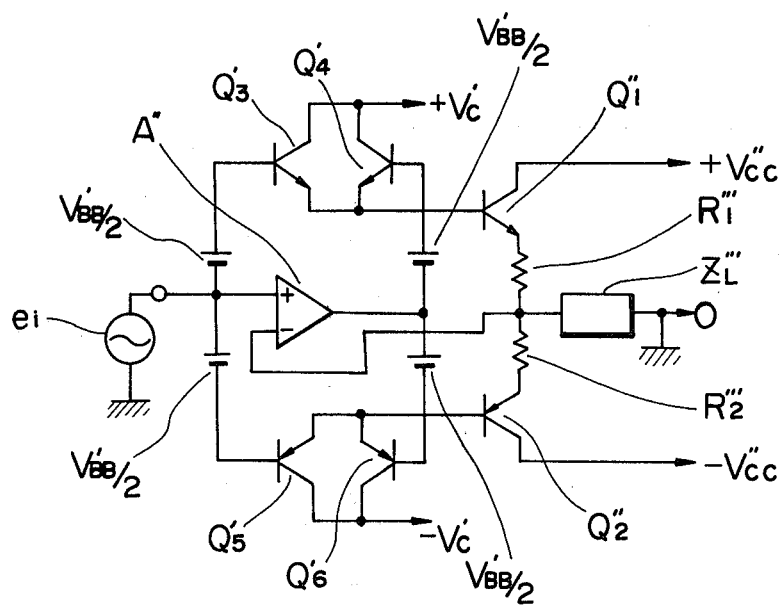
FIG. 7 is a circuit diagram of another embodiment of a push-pull amplifier circuit according to the present invention.

FIG. 7 shows a circuit in which performance is improved in practice wherein a sum output between common emitter electrodes of the transistors is obtained similarly to the FIG. 6 circuit, but the output of the common emitter is not directly connected to the load, but it is Darlington-connected to a push-pull amplifier comprising separate transistors.

Referring to FIG. 7, $Q''_1$ and $Q''_2$ denote NPN and PNP transistors, $R''_1$, $R''_2$ resistors for stabilizing bias current, $Z'''_L$ a load including reactance, $V'_{BB}/2$ bias power supply circuit, $+V'_c$ and $+V'''_{cc}$ plus DC power supply circuits, $-V'_c$ and $-V'_{cc}$ minus DC power supply circuits, $A''$ DC amplifier, $Q'_3$, $Q'_4$, $Q'_5$, and $Q'_6$ transistors which have the same function as the diodes of the basic circuit shown in FIG. 2 with the addition of a current amplification function.

The operation of this circuit is the same as the basic circuit. This circuit is characterized in that transistors $Q'_3$, $Q'_4$ are connected to transistor $Q''_1$ of the push-pull circuit by Darlington-connection, and transistors $Q'_5$ and $Q'_6$ are also connected to transistor $Q''_2$ of the push-pull circuit by Darlington-connection. With this circuit, it is possible to lessen the load on the DC amplifier circuit $A''$, and also that on the input power supply.

As stated above, the present invention provides for high linearity even for reactance loads. Accordingly, this circuit is widely applicable to various kind of stabilized power supply circuit.

Particularly, if the circuit of FIG. 7 is used as a stabilizing circuit and using a reference power supply as an input $e_i$, not only a good source ability for supplying a current but also a good sink ability for absorbing current will be obtained, thereby improving performance over that of a conventional amplifier.

Figure 8:
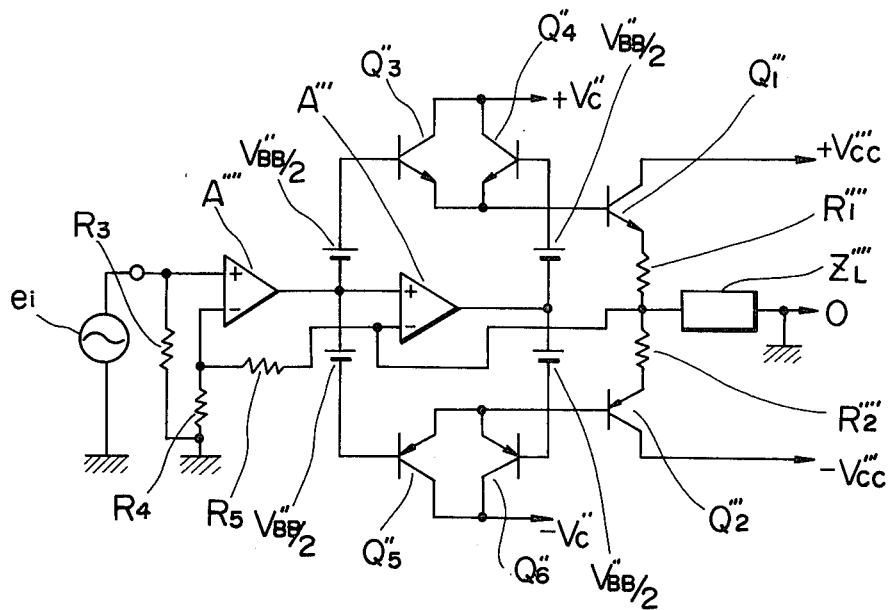
FIG. 8 is a circuit diagram wherein a push-pull circuit according to the present invention is applied to a high fidelity amplifier.

Reference is finally made to the embodiment applicable to a high fidelity amplifier illustrated in FIG. 8, wherein $Q'''_1$ and $Q'''_2$ denote NPN and PNP transistors, $R''''_1$, $R''''_2$ resistors for stabilizing bias current, $Z''''_L$ a load including reactance, $V''_{BB}/2$ bias power supply circuit, $+V''_c$ and $-V'''_c$ plus DC power supply circuits, $-V''_c$ and $-V''_c$ minus DC power supply circuits, and $Q''_3$, $Q''_4$, $Q''_5$ and $Q''_6$ transistors which have the same function as the corresponding transistors $Q'_3$, $Q'_4$, $Q'_5$ and $Q'_6$ shown in FIG. 7.

In this example, two DC amplifiers are employed, whereby an amplifier $A'''$ for adjusting the bias is included within a feedback loop for the amplifier $A''''$ which sets the gain.

It is to be understood that modifications and variations of the embodiments of the invention disclosed herein may be resorted to without departing from the spirit of the invention and the scope of the appended claims.

What is claimed is:

1. An amplifier comprising:
   (a) means for supplying an input signal to said amplifier;
   (b) a push-pull amplifier including first and second complementary transistors having respective output terminals connected together at a first junction, said first junction being connected to a load;
   (c) a DC amplifier having a non-inverting input terminal and an inverting input terminal, said means for supplying an input signal being connected to said non-inverting input terminal, said first junction being connected to said inverting input terminal;
   (d) a first biasing power supply circuit having first and second halves operative together to produce a predetermined first potential and a first biasing current, a first junction at first terminals of said first and second halves being connected to said first and second transistors respectively, a second junction at second terminals of said first and second halves, each of said first and second halves being operative to establish half of said first potential at said first terminals thereof, said means for supplying an input signal being connected to second junction;
   (e) a second biasing power supply circuit having third and fourth halves operative together to produce a predetermined second potential and a second biasing current, a third junction at first terminals of said third and fourth halves, each of said third and fourth halves being operative to establish half of said second potential at second terminals thereof, said DC amplifier having an output connected to said third junction, and;
   (f) means responsive to an output of said DC amplifier for applying the first predetermined potential to the base of said first transistor and applying the second predetermined potential to the base of said second transistor, or conversely effecting the same, to produce a bias current in said push-pull amplifier which balances one half of said first potential with a potential at said first junction.

2. An amplifier comprising:
   (a) means for supplying an input signal to said amplifier;
   (b) a push-pull amplifier including first and second complementary transistors, each of said first and second transistors having its emitter commonly connected with the emitter of the other thereof at an output terminal, said output terminal being connected to a load at a first junction, means for applying a positive and a negative DC voltage to collectors of said first and second transistors respectively;
   (c) a DC amplifier having a non-inverting input terminal and an inverting input terminal, said means for supplying an input signal being connected to said non-inverting input terminal and an output of said push-pull amplifier being connected to said inverting input terminal;
   (d) a first biasing power supply circuit, having a positive and a negative terminal, said first biasing power supply circuit being operative to produce a predetermined first potential and a first biasing current, and having first and second halves connected together at a second junction, first terminals of said first and second halves being connected to bases of said first and second transistors, each of said first and second halves being effective to establish one half of said first potential, said means for supplying an input signal being connected to said second junction;
   (e) a second biasing power supply circuit having a positive and a negative terminal, said second biasing power supply circuit being operative to produce a predetermined second potential and a second biasing current, said second biasing power supply circuit including third and fourth halves connected together at a third junction, each of said third and fourth halves being effective to establish one half of said second potential, said DC amplifier having an output connected to said third junction; and
   (f) means responsive to an output of said DC amplifier for applying the first predetermined potential to the base of said first transistor and applying the second predetermined potential to the base of said second transistor, or conversely effecting the same, to produce a bias current in said push-pull amplifier which balances one half of said first potential at said first junction.

3. An amplifier as defined in claim 1 or 2, wherein said first half of said first biasing power supply circuit is connected to said non-inverting terminal and the output terminal of said DC amplifier is connected to said first half of said second biasing power supply circuit.

4. An amplifier arrangement as defined in claim 1 or 2, wherein said responsive means includes first and second diodes, an anode of said first diode being connected to a positive terminal of said first biasing power supply circuit, an anode of said second diode being connected to a positive terminal of said second biasing power supply circuit, a cathode of each of said first and second diodes being jointly connected to the base of said first transistor, and third and fourth diodes, the cathode of said third diode being connected to a negative terminal of said first biasing power supply circuit, the cathode of said fourth diode being connected to a negative terminal of said second biasing power supply circuit, an anode of each of said third and fourth diodes being jointly connected to the base of said second transistor.

5. An amplifier as defined in claim 1 or 2, wherein said responsive means includes a third transistor having its collector and emitter commonly connected to the collector and emitter respectively of said first transistor and a fourth transistor having its collector and emitter commonly connected to the collector and emitter respectively of said second transistor and said halves of said second biasing power supply circuit being connected respectively to bases of said third and fourth transistors.

6. An amplifier as defined in claim 2, wherein said responsive means includes two pairs of transistors, wherein each pair comprises two transistors with their respective collectors and emitters commonly connected.

7. An amplifier as defined in claim 1 or 6, which further comprises a second DC amplifier having a non-inverting terminal connected to said means for supplying an input signal, and an inverting terminal thereof connected to the inverting terminal of the first mentioned DC amplifier and through a resistor to ground, the output of said second DC amplifier be connected to said third junction.

8. An amplifier as defined in claim 6, further comprising at least one additional transistor connected to one of said two pairs of transistors to form a Darlington amplifier, an output terminal of which is connected to the load.

9. An amplifier as defined in claim 1, wherein said responsive means includes two pairs of transistors, wherein each pair includes two transistors connected so that respective collectors and emitters are commonly connected.

10. An amplifier as defined in claim 9, which further comprises a second DC amplifier wherein a non-inverting terminal thereof is connected to said means for supplying an input signal, and an inverting terminal thereof is connected to the inverting terminal of the first mentioned amplifier and through a resistor to ground, an output of said second DC amplifier being connected to said third junction.

11. An amplifier as defined in claim 9 or 10, further comprising at least one additional transistor connected to one of said pairs of transistors to form a Darlington amplifier, an output terminal of said Darlington amplifier being connected to the load.

12. A single-ended push-pull amplifier comprising:
first and second transistors of complementary types having their collector-emitter paths connected in series and providing an output current and an output voltage to a load, said output current and output voltage being taken between the emitter of said first transistor and the emitter of said second transistor;
first and second means for applying an input signal voltage to bases of said first and second transistors, respectively;
said first and second means for applying including first and second bias sources;
said first and second bias sources being effective in the absence of said signal voltage to maintain a predetermined bias current to the bases of said first and second transistors;
a dc differential amplifier having a non-inverting input, an inverting input and a gain much greater than one;
said input signal being connected to one of said non-inverting and inverting inputs;
said output voltage being connected to the other of said non-inverting and inverting inputs;
third and fourth means for applying an output of said differential amplifier to said first and second transistors, respectively;
said third and fourth means for applying including third and fourth bias sources having voltages respectively substantially equal to said first and second bias sources;
first means for transferring the one of said first and third means having a more positive voltage for application to said first transistor; and
second means for transferring the one of said second and fourth means having a more negative voltage for application to said second transistor.

13. A single-ended push-pull amplifier according to claim 12 wherein said first means for transferring includes first and third diodes having their cathode terminals connected to the base of said first transistor, said first diode having its anode terminal connected to said first bias source, said third diode having its anode terminal connected to said third bias source, said second means for transferring includes second and fourth diodes having their anode terminals connected to the base of said second transistor, said second diode having its cathode terminal connected to said second bias sources, and said fourth diode having its cathode terminal connected to said fourth bias source.

14. A single-ended push-pull amplifier according to claim 12 wherein said third means for applying includes a third transistor having its collector and emitter connected respectively to the collector and emitter of said first transistor and having its base connected to said third bias source, a fourth transistor having its collector and emitter connected respectively to the collector and emitter of said fourth bias source.

15. A single-ended push-pull amplifier according to claim 14, further comprising a fifth transistor having its base connected to the emitters of said first and third transistor and its collector connected to a first voltage source of a first polarity, a sixth transistor having its base connected to the emitters of said second and fourth transistors and its collector connected to a second voltage having a polarity opposite said first polarity, said output current and voltage being taken between the emitters of said fifth and sixth transistors.

16. A single-ended push-pull amplifier according to claim 12, 13, 14 or 15 further comprising means for setting the gain of said amplifier.

* * * * *